(12) United States Patent
Van Dyck et al.

(10) Patent No.: US 6,920,368 B1
(45) Date of Patent: Jul. 19, 2005

(54) METHOD AND DEVICE FOR CORRECTING PROXIMITY EFFECTS

(76) Inventors: Dirk Ernst Maria Van Dyck, Kleine Grippe 37, B-2630 Aartselaar (BE); Piotr Tomasz Jedrasik, Groeneborgerlaan 171, B-2020 Antwerpen (BE)

(*) Notice: Subject to any disclaimer, the term of this patent is extended or adjusted under 35 U.S.C. 154(b) by 0 days.

(21) Appl. No.: 09/719,757
(22) PCT Filed: Jun. 14, 1999
(86) PCT No.: PCT/BE99/00076
§ 371 (c)(1), (2), (4) Date: Jul. 16, 2001
(87) PCT Pub. No.: WO99/66530
PCT Pub. Date: Dec. 23, 1999

(30) Foreign Application Priority Data

Jun. 16, 1998 (NL) ............................................. 1009422
Oct. 13, 1998 (NL) ............................................. 1010311

(51) Int. Cl.⁷ ............................................. G06F 19/00
(52) U.S. Cl. ........................ 700/121; 700/57; 700/160; 250/492.2; 250/492.22; 250/492.3; 355/53; 355/55; 355/77; 430/5; 430/296; 430/942; 716/19; 716/21; 706/12; 706/16; 706/21; 706/23; 706/24; 706/25
(58) Field of Search .................. 700/57, 121, 160; 250/492.2, 492.22, 492.3; 355/53, 55, 77; 430/5, 296, 942; 716/19, 21; 706/12, 16, 21, 23, 24, 25

(56) References Cited
U.S. PATENT DOCUMENTS 5,736,281 A * 4/1998 Watson ........................ 430/30
6,035,113 A * 3/2000 Gerber et al. .................. 716/19

FOREIGN PATENT DOCUMENTS
EP 0812000 A2 * 12/1997

OTHER PUBLICATIONS

Jedrasik, P. et al. "Optimal filtering versus regularization methods in the Fourier precompensation based proximity neurocorrection in electron beam lithography," *Microelectronic Eng.* 41–42: 195–198 (1998).

Jedrasik P. "Neural networks application for fast, direct correction kernel generation for proximity effects correction in electron beam lithography," *Microelectronic Eng.* 27(1–4): 191–194 (1995).

Frye, R.C. "Adaptive neural network algorithms for computing proximity effect corrections," *J Vacuum Sci & Tech* (*Part B*) 9(6): 3054–3058 (1991).

* cited by examiner

*Primary Examiner*—Anthony Knight
*Assistant Examiner*—Douglas Shute
(74) *Attorney, Agent, or Firm*—The Webb Law Firm

(57) ABSTRACT

The present invention relates to a method for determining the precompensated pattern of exposure doses of an electron beam required per pattern position to obtain a desired pattern in a coating on a substrate, comprising the steps of: determining a smearing function of the electron beam; determining a precompensated pattern with the smearing function and the desired pattern, wherein the determination is performed such that exposure doses contain almost exclusively positive values and the exposure doses are smooth relative to each other.

17 Claims, 4 Drawing Sheets

METHOD AND DEVICE FOR CORRECTING PROXIMITY EFFECTS

BACKGROUND OF THE INVENTION

The present invention relates to a method and device for determining the exposure dose of an electron beam required per pattern position to obtain a desired pattern in a coating.

In the manufacture of the latest generations of integrated circuits use is preferably made of focused electron beams in lithographic processes instead of making use of the usual optical lithographic techniques, since these latter techniques are subject to limitations in terms of resolution as a result of diffraction of the used laser light. The resolution of the integrated circuit obtained with such electron beam lithography is greater, although it is limited by scattering of the electrons in the coating. Methods are known for minimizing scattering effects or compensating therefor in advance and thereby improving the resolution of the obtained integrated circuits.

The known methods have the drawback however that scattering effects can themselves only be minimized to a limited degree, while advance compensation according to the known method requires many calculations and therefore needs a long calculation time. For the manufacture of integrated circuits for instance a very large number of pattern points, often in the order of magnitude of $10^{10}$ pattern points, must be "written", while the number of calculations required for this purpose amounts to a multiple thereof. As a result a practically real time precompensation for the smearing or blurring effects cannot be implemented.

The object of the present invention is to obviate this drawback and also provide additional advantages.

SUMMARY OF THE INVENTION

The present invention therefore, relates to a method for determining the precompensated pattern of exposure doses of an electron beam required per pattern position to obtain a desired pattern in a coating on a substrate, comprising the steps of:
determining the smearing function (blur function) of the electron beam;
determining the precompensated pattern with the smearing function and the desired pattern, wherein the determination is performed such that the exposure doses contain almost exclusively positive values and that the exposure doses are at least to some extent smooth relative to each other.

Since a negative value for the exposure doses of an electron beam has no physical significance and cannot therefore be realized, the determination of the exposure doses of the precompensated pattern is performed such that it assumes (almost) exclusively positive values. A smooth solution is furthermore obtained since strong oscillations in the smearing function have no physical basis but are caused solely by mathematical instability of the calculations.

In a preferred embodiment of the invention the method comprises the steps of:
a) estimating a regularization parameter;
b) determining a precompensated pattern with all pattern points of the desired pattern with the exception of a determined pattern point;
c) smearing the precompensated pattern again with the smearing function in order to predict the dose of the determined pattern point;
d) repeating steps b and c for each pattern point;
e) repeating steps a to d with adapted regularization parameter until a final value of a regularization parameter is obtained;
f) determining the precompensated pattern with the final value of the regularization parameter.

According to a further embodiment of the invention step b) comprises the following iterative definition:

$$d^{(l)}=d^{(l-1)}+(K^\triangledown K+\lambda B(D))^{-1}K^\triangledown r^{(l-1)} \quad r^{(l)}=a-Kd^{(l)}$$

with $d^{(0)}=0$ and $r^{(0)}=a$
in which a is a vector with the doses of the desired pattern as elements, d is a vector with the exposure doses of the precompensated pattern, K is the smearing function in matrix form, $K^\triangledown$ is the Hermitian conjugate of the smearing function K, B is an operator and $\lambda$ a regularization parameter.

According to a further embodiment of the invention operator B is defined as follows:

$$B(D) = \sum_i \left(\frac{d_i}{d_{tot}}\right) \ln\left(\frac{d_i}{d_{tot}}\right)$$

in which the summation takes place over all pattern points, $d_i$ is the $i^{th}$ element of the vector d, and $d_{tot}$ represents the summation over all elements of the vector d.

According to a further embodiment of the invention the final value of the regularization parameter in the above mentioned step e) is the regularization parameter wherein $$\frac{1}{N}\sum_{k=1}^{N} (a_k - [Kd_k(\lambda)]_k)^2$$

in which N is the total number of pattern points, a is a vector with the doses of the desired pattern as elements, d is a vector with the exposure doses of the precompensated pattern and K the smearing function in matrix form.

According to a further embodiment of the invention the final value of the regularization parameter in step e) is the minimal regularization parameter wherein $$\frac{1}{N}\sum_{k=1}^{N} (a_k - [Kd^k(\lambda)]_k)^2 w_{kk}(\lambda)$$

in which N is the total number of pattern points, a is a vector with the doses of the desired pattern as elements, d is a vector with the exposure doses of the precompensated pattern, K is the smearing function in matrix form and $w_{kk}$ is defined as:

$$w_{kk}(\lambda) = \left[\frac{1-a_{kk}(\lambda)}{1-\frac{1}{N}\sum_{j=1}^{N} a_{jj}(\lambda)}\right]^2$$

with $a_{kk}$ the elements of the matrix $A=(K^T K+\lambda L(D)^T L(D))^{-1}K^T$ and L the discrete Laplace transformation.

According to a further embodiment of the invention after step e) the step is performed of training a neural network using one or more desired first patterns and the associated precompensated patterns.

According to a further embodiment of the invention the precompensated pattern associated with a second desired pattern can be determined with the trained neural network, wherein in a further embodiment the first desired pattern is a relatively simple training pattern and the second desired pattern is the partial pattern of an integrated circuit, and wherein in a further embodiment two or more partial patterns can be combined into a composite pattern of the integrated circuit.

By determining the associated precompensated pattern of exposure doses for a known desired pattern, which is preferably simple, and then establishing the relation between the weighting factors of a neural network, is ensured that for a second desired pattern, which may be complicated, obtaining the relation between this pattern and the associated exposure doses is determined in very efficient and rapid manner by the neural network. The first pattern is generally a relatively simple training pattern, while the second pattern is for instance the pattern of a very complicated integrated circuit.

In a preferred embodiment of the invention the above stated neural network is implemented in hardware, whereby determining of the relation between a pattern and the exposure dose associated therewith is performed in more rapid manner, for instance within 60 ns for each pattern point and within 10 minutes for a pattern of $10^{10}$.

According to a preferred embodiment of the invention the smearing function is made up of at least two Gaussian functions, to which an exponential function is optionally added. Parameters of the Gaussian functions and optionally the exponential function can be determined by means of statistical simulation of the system of electron beam transmitting equipment and the relevant coating and substrate of the integrated circuit for manufacture.

In another embodiment of the invention parameters are determined by performing measurements on the system of electron beam transmitting equipment and the relevant coating with substrate.

The present invention also relates to a device for determining the exposure dose of an electron beam required per pattern position to obtain a desired pattern in a coating on a substrate, comprising an electronic circuit for implementing said neural network with weighting factors determined in the above stated manner.

BRIEF DESCRIPTION OF THE DRAWINGS

The invention will be elucidated hereinbelow with reference to a preferred embodiment thereof, wherein use will be made of the annexed drawings, in which:

FIG. 7 shows the precompensated pattern of

FIG. 6 after smearing; and

DESCRIPTION OF THE PREFERRED EMBODIMENT

Figure 1:
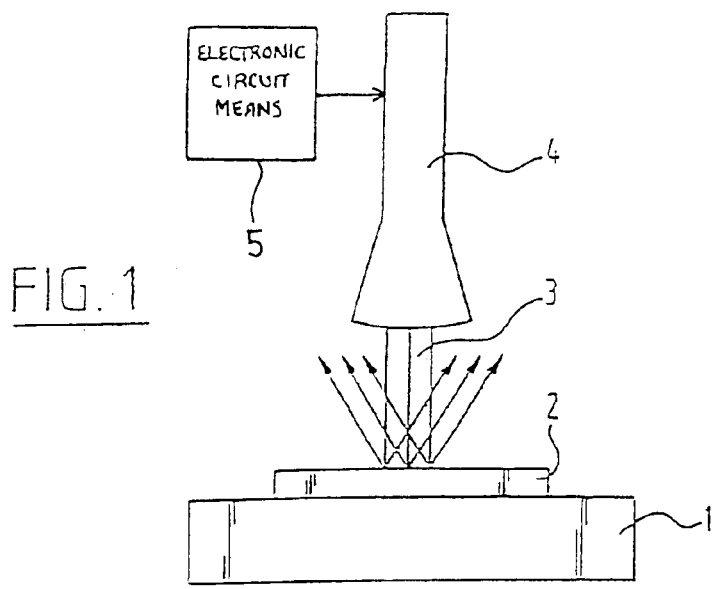
FIG. 1 shows a schematic overview of a preferred embodiment of a device according to the invention.

In an arrangement of equipment for transmitting an electron beam and a substrate 1 with coating 2 for processing, a beam of electrons 3 is directed at a position or pattern point of a coating 2 on a substrate 1. The interaction of the incident electron beam 3 with the coating or resist film 2 and the underlayer or substrate 1 results in a scattering of the electrons in coating 2 which causes smearing or proximity effects. When for instance a primary electron penetrates into the coating, a part of its energy is transferred to electrons of the atoms of the coating, which causes ionization or excitation thereof. A collision between electrons with a large transfer of energy generates a secondary electron which generally has a direction of movement perpendicular to that of a primary electron.

Smearing effects in electron beam lithography relate more generally to the process whereby the resolution of the exposed pattern is reduced by primary electron scattering (forward scattering) and secondary electron excitation (backward scattering) in the coating and the substrate of an integrated circuit for manufacture. Sharp features such as angles in the desired pattern are rounded, line thicknesses and interspaces are modified and in particular extreme cases some features even disappear completely or are merged in incorrect manner with adjacent features.

The smearing effects or proximity effects can be described by a smearing function, which shows the relation between on the one hand the exposure doses of a determined pattern point of a pattern for manufacturing in the coating and on the other the doses actually absorbed by this pattern point and adjacent pattern points. The effect of the smearing is thus established in the smearing function.

Assuming that exposure and smearing are linearly and spatially invariant and that for a numeric solution a discrete representation is preferred, the above can be expressed in matrix form as follows: A=KD, in which A is a column vector of which each element $a_i$ is the total energy dose which is actually absorbed in the associated pattern point, K is a smearing matrix of which each $mn^{th}$ element is the portion of the energy dose which is absorbed in pattern point m from a unit-exposure dose supplied to pattern point n, and D is a column vector made up of elements $d_i$ which represent the exposure doses generated per pattern point by the electron beam equipment. Since the smearing effect is unavoidable, it is best to adapt the exposure doses $d_i$ of the different pattern points such that the dose $a_i$ actually absorbed in a pattern point is such that the desired pattern is still obtained.

This so-called precompensation of the exposure dose of the electron beam can be performed according to the prior art by determining the inverse of the smearing matrix K. There are many ways of generally inverting a matrix. However, these methods often take no account of physical limitations, such as in this case for instance those of the electron beam transmitters. No negative exposure doses for instance are thus possible. A further drawback of such inversion methods is that the inverted matrix has many oscillations. In addition, for inversion of the smearing matrix for a partial pattern of for instance 256×256 pattern points the inversion of a smearing matrix with dimensions of 65536×65536 has to be calculated, which requires an enormous amount of calculating time.

Figure 2A:
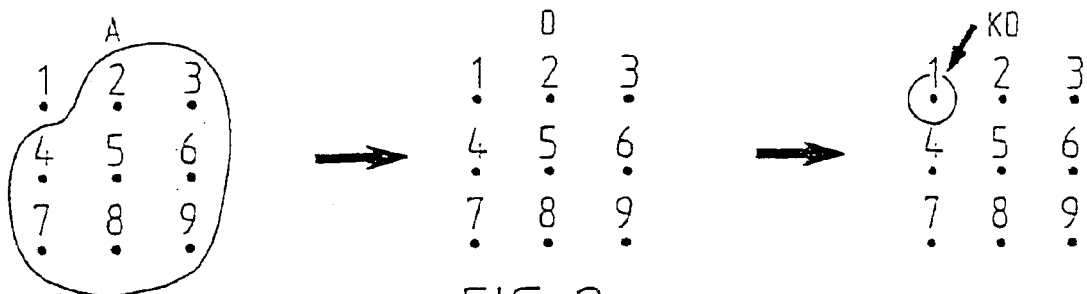
FIGS. 2a–2c show a schematic overview of the determination of a precompensated pattern of 3×3 pattern points.
Figure 2B:
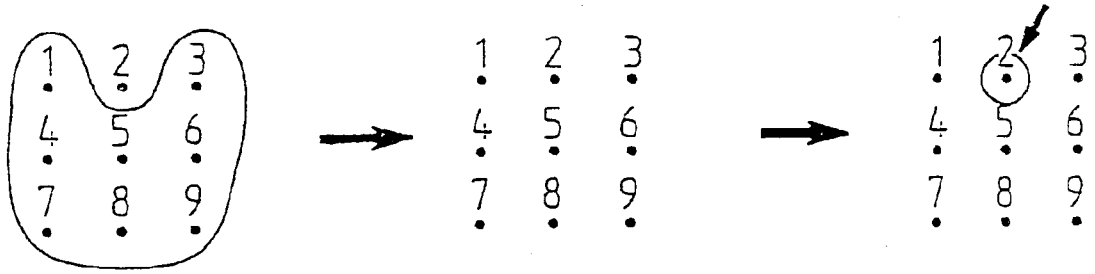
Figure 2C:
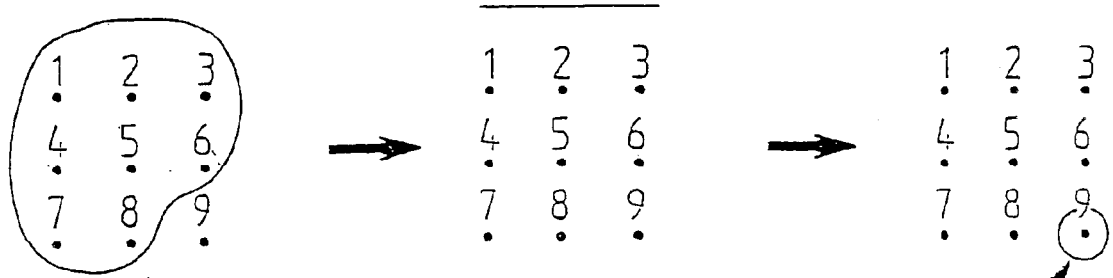

FIGS. 2a to 2c show a desired pattern (A). The pattern is built up of 9 pattern points $a_i$ wherein i varies from 1 to 9. This desired pattern must be precompensated in order to be able to provide the desired pattern after exposure to the smearing electron beam, i.e. the values of $d_i$, with i varying from 1 to 9, have to be determined.

The precompensated pattern is first of all determined making use of the doses $a_i$ with i from 2 to 9, wherein pattern point 1 is not therefore taken into account (FIG. 2a). This precompensated pattern is determined on the basis of the following expression:

$$d^{(l)} = d^{(l-1)} + (K^\nabla K + \lambda B(D))^{-1} K^\nabla r^{(l-1)} \quad r^{(l)} = a - Kd^{(l)}$$

with $d^{(0)} = 0$ and $r^{(0)} = a$ wherein a is a vector with the doses of the desired pattern as elements, d is a vector with the exposure doses of the precompensated pattern, K is the smearing function in matrix form, $K^\nabla$ is the Hermitian conjugate of smearing function K, B is an operator and $\lambda$ a regularization parameter. The value of the regularization parameter can be chosen at random, in this case for instance $\lambda = 0$.

The operator B imposes a limitation and can be defined as follows:

$$B(D) = \sum_i \left(\frac{d_i}{d_{tot}}\right) \ln\left(\frac{d_i}{d_{tot}}\right)$$

in which the summation takes place over all pattern points, $d_i$ is the $i^{th}$ element of the vector d, and $d_{tot}$ represents the summation over all elements of the vector d.

The thus determined precompensated pattern is then smeared once again on the basis of the known smearing function, whereby the predicted dose Kd of pattern point 1 is determined.

The above procedure is then repeated successively (FIGS. 2b and 2c) for the second to ninth pattern point (i=2, ..., 9), wherein all pattern points with the exception of one pattern point are used each time.

On the basis of the above results, the least squares prediction error over all pattern points is determined, which will be further explained later.

The above procedure is subsequently repeated with different values for the regularization parameter $\lambda$, for instance $\lambda_2 = 0.001$, $\lambda = 0.002$ etc. The regularization parameter is eventually chosen wherein the least squares prediction error over all pattern points is minimal. This regularization parameter is then chosen as the optimal regularization parameter $\lambda_{opt}$. The final precompensated pattern is then determined on the basis of this optimal regularization parameter $\lambda_{opt}$.

For this purpose the minimum is determined of the expression:

$$\frac{1}{N} \sum_{k=1}^{N} (a_k - [Kd^k(\lambda)]_k)^2 w_{kk}(\lambda)$$

in which N is the total number of pattern points, a is a vector with the doses of the desired pattern as elements, d is a vector with the exposure doses of the precompensated pattern, K is the smearing function in matrix form and $w_{kk}$ is defined as:

$$w_{kk}(\lambda) = \left[\frac{1 - a_{kk}(\lambda)}{1 - \frac{1}{N}\sum_{j=1}^{N} a_{jj}(\lambda)}\right]^2$$

with $a_{kk}$ the elements of the matrix $A = K(K^T K + \lambda L(D)^T L(D))^{-1} K^T$ and L the Laplace operator.

The smearing function resulting from forward scattering and backward scattering of the electrons of the electron beam can be determined in different ways. It can be determined on the basis of measurements of the impulse response of the equipment for transmitting the electron beam on a test object. The smearing function can also be determined using diverse Monte Carlo techniques. In the first method of determination all physical aspects of the equipment used are taken into account. In the latter mentioned method of determination only a model of the reality is used, although the determination is however easier to perform without requiring extensive measurements.

Gaussian functions are preferably used as approximation for the smearing functions determined in any of the above described methods. The smearing function is in this case "fitted", for instance with a scattering fit model of a double Gaussian function (for both forward and backward scattering properties of the electrons), a triple Gaussian function or a double Gaussian function with a decreasing exponential function. The choice of the scattering fit model depends on the dimensions of the components to be distinguished in the test object (resolution). At dimensions smaller than 100 nm the choice hereof becomes critical: at such small dimensions the triple Gaussian functions or double Gaussian functions with decreasing exponential function are recommended. A smearing function with double Gaussian function can be described with 3 parameters, while the other two stated scattering fit models can be described with 4 parameters, which implies a great reduction in the quantity of data for processing.

Figure 3:
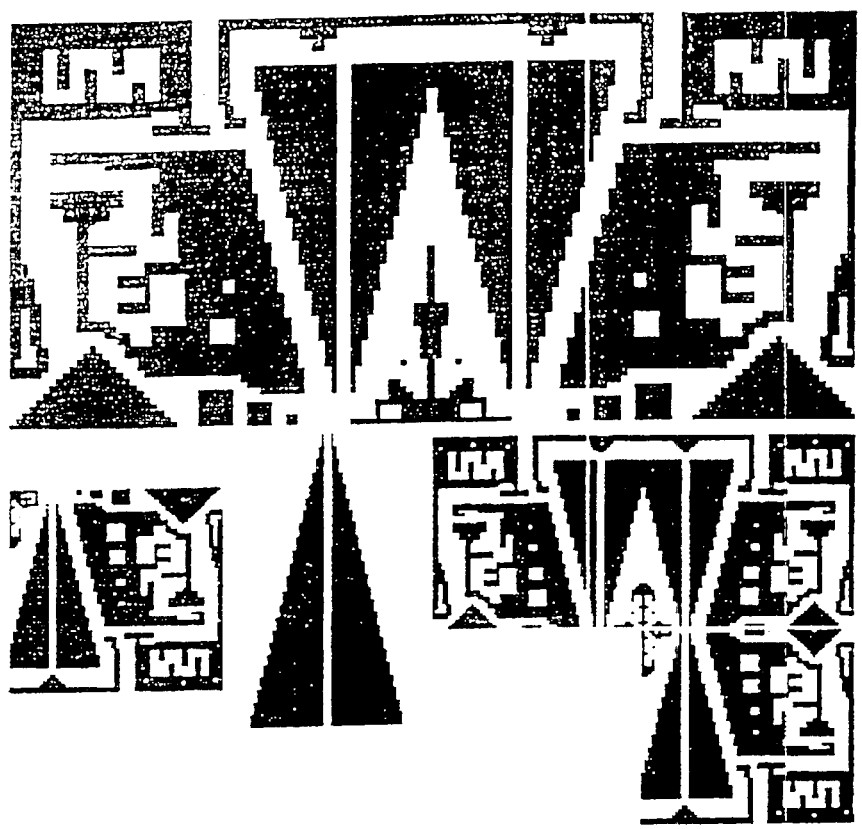
FIG. 3 shows a desired training pattern or 256×256 pattern points.
Figure 4:
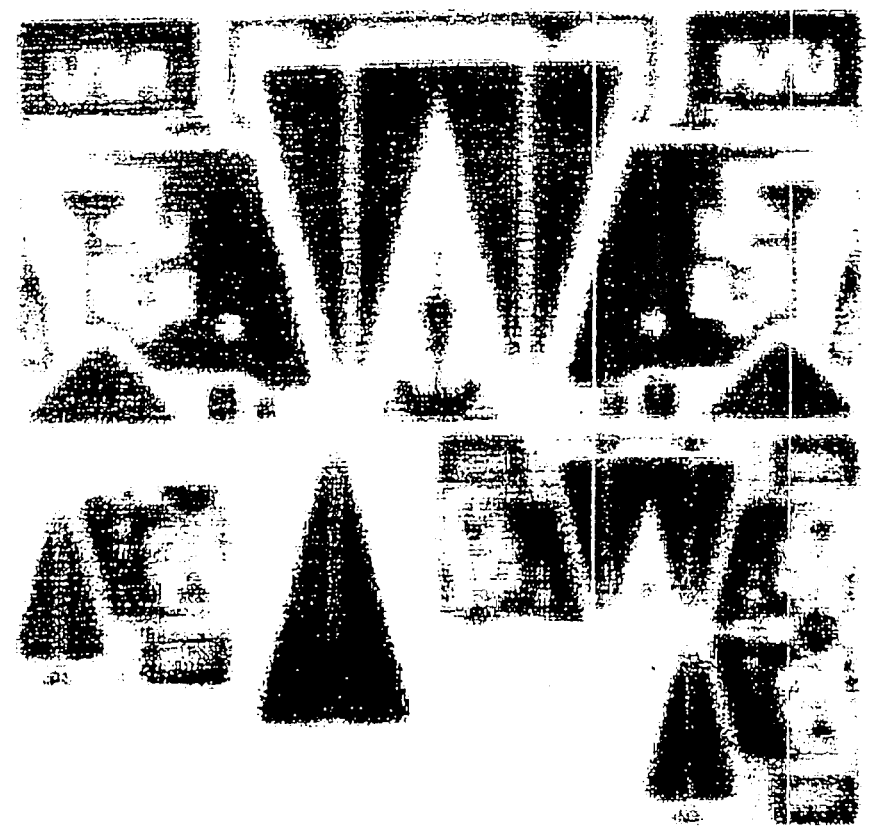
FIG. 4 shows the training pattern of FIG. 3 after smearing.
Figure 5:
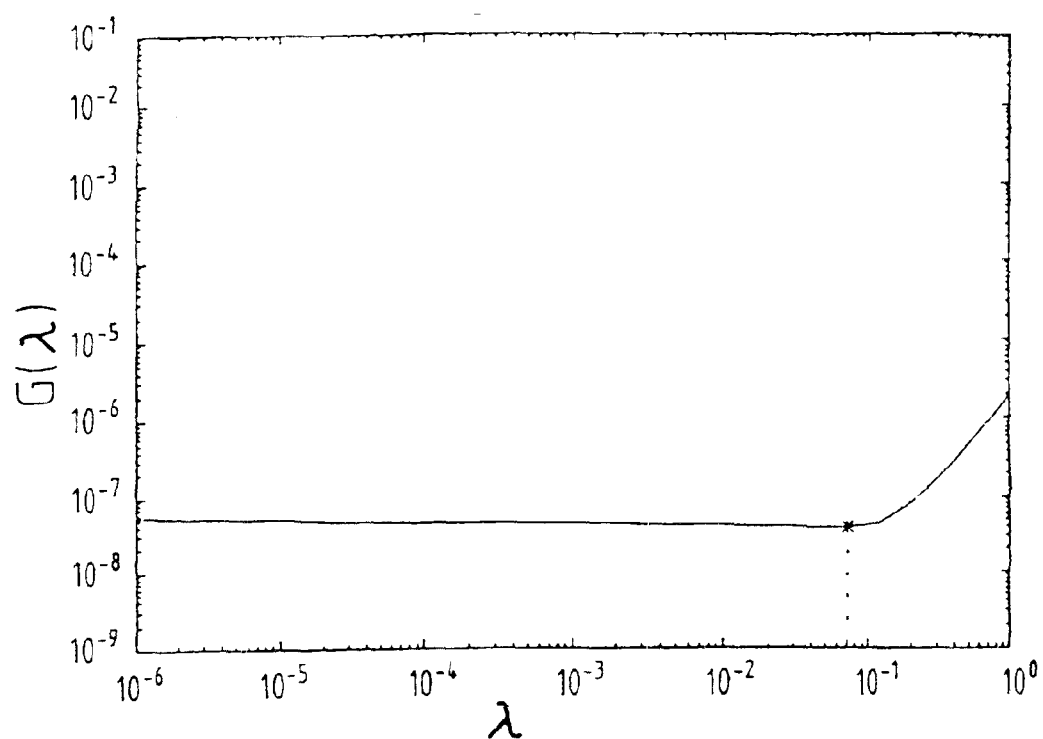
FIG. 5 shows a graph in which for the training pattern of FIG. 3 the prediction error is plotted as a function of the chosen regularization parameter.
Figure 6:
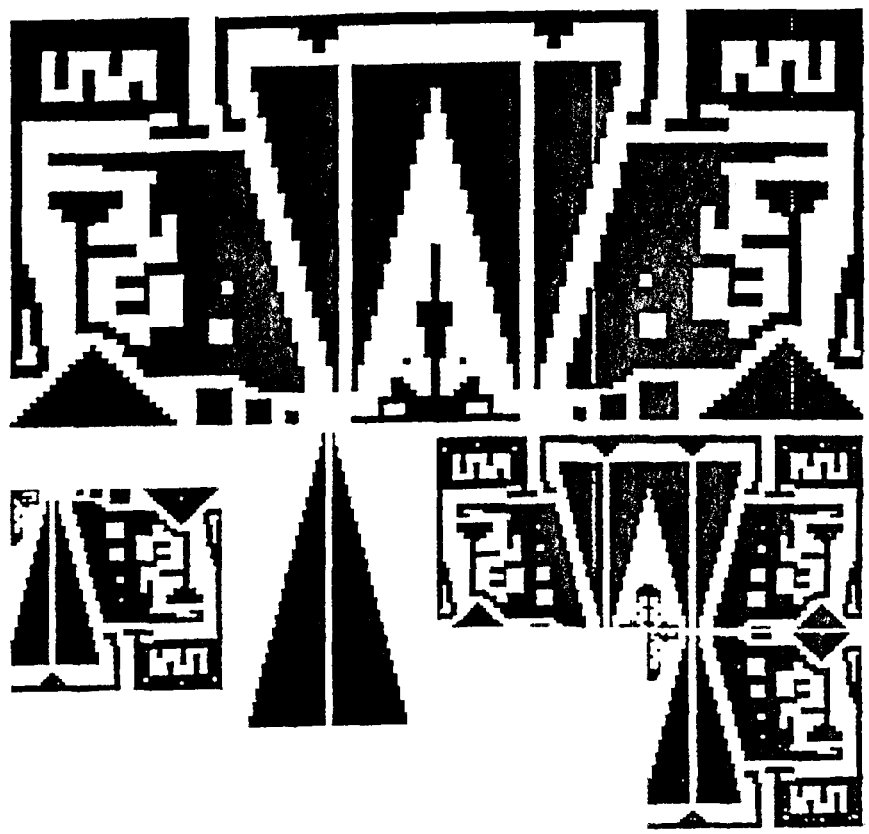
FIG. 6 shows the training pattern of FIG. 3 after precompensation.
Figure 7:
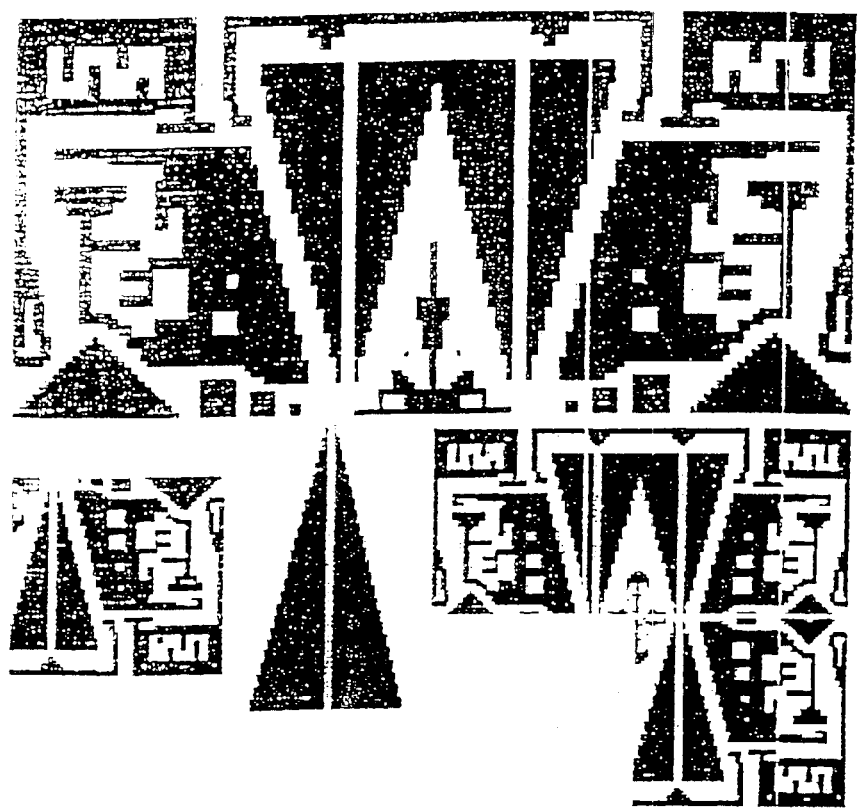

FIG. 3 shows a desired pattern of 256×256 pattern points. Smearing with a smearing function in the form of a double Gaussian function with $\alpha = 50$ nm, $\beta = 3.45$ and $^n = 1.36$ produces the smeared pattern of FIG. 4. It is clearly visible that much detail in the pattern has been lost, which means a limitation in the resolution to be obtained of the pattern for manufacture. Application of the method according to the invention produces an optimal regularization parameter of $\lambda_{opt} = 0.07042$, which is shown in FIG. 5, in which the error in the pattern is minimal at this value of $\lambda$. The precompensated pattern calculated with this value of $\lambda$ and the associated smeared pattern are shown respectively in FIGS. 6 and 7. Comparison of the results of FIG. 7 with those of FIG. 3 shows that the precompensation of the pattern with a desired pattern produces a smeared pattern with a greatly improved resolution. Components for distinguishing with dimensions of less than 100 nm, for instance in an integrated circuit, can hereby be realized. A comparison of the results of the method described herein with those of other correction methods is shown in table 1. The degree of error of the correction methods is defined here as the summation of the difference between the calculated exposure doses and the ideal precompensated exposure doses divided by the number of pattern points.

Table 1

| Correction method | degree of error in % |
| --- | --- |
| Uncorrected | 10.2% |
| Truncating | 10.2% |
| Shifting and scaling | 12.2% |
| Present method | 4.9% |

From the above can be seen that the present method of determining a precompensated pattern produces by far the smallest degree of error compared to the other usual methods.

Figure 8:
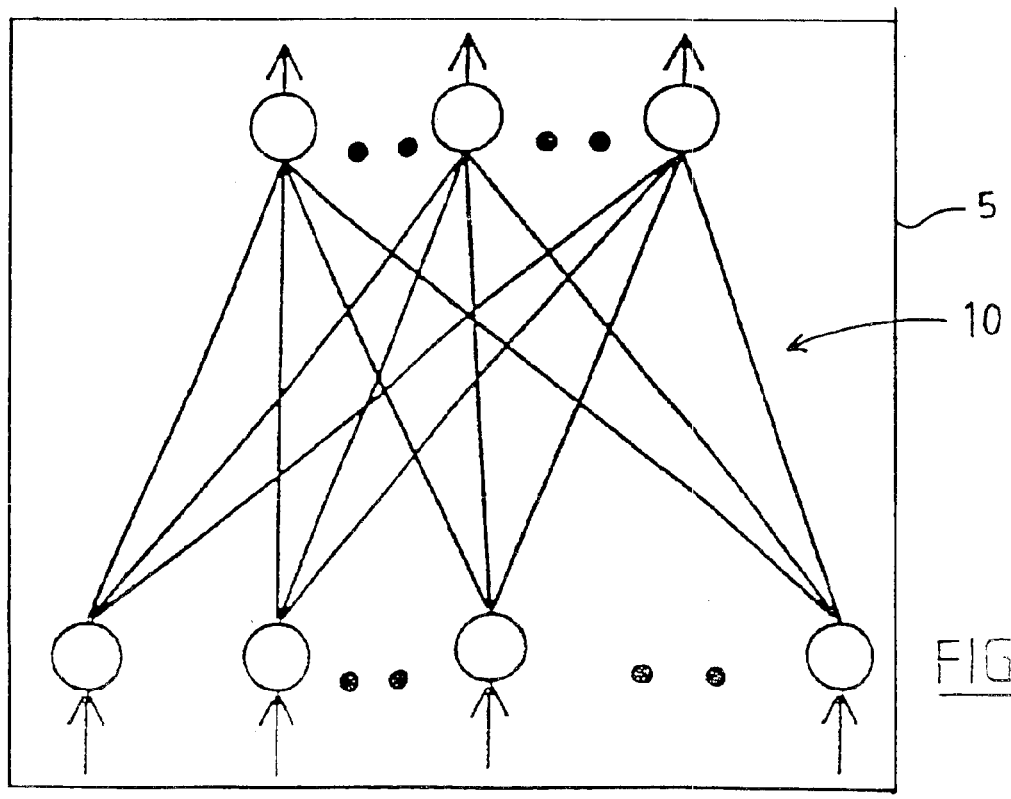
FIG. 8 is a schematic representation of a neural network for determining precompensated patterns.

The precompensated pattern and the desired pattern are subsequently used as training set or training patterns for a neural network. A part of such a network 10 is shown schematically in FIG. 8 and is represented by the expression $$a_i = \sum_{j=1}^{9} w_{ij} h_{ij}(x)$$

i.e. the dose a, is expressed in a set of 9 basic functions $h_{ij}$, in this case radial functions.

After training of the neural network 10 a precompensated pattern can be determined for another random desired pattern in very rapid manner. A random pattern can for instance be a pattern of 512 by 512 pattern points forming a partial pattern of an integrated circuit. Various partial patterns can then be combined (clustered) to form one pattern which comprises the whole integrated circuit or at least a part thereof.

The above described neural network 10 can be implemented in hardware, and preferably in analog hardware since the calculating speed of neural networks implemented in this manner is very great. The calculating time for precompensation of a pattern thus amounts to less than 60 ns per pattern point. Precompensation of a pattern of an integrated circuit of about $10^{10}$ pattern points requires in this case only about 10 minutes on present personal computers.

The invention is further described in the non-prepublished doctoral thesis with the title "Proximity effects correction in electron beam nanolithography", the entire content of which should be deemed as incorporated herein.

In order to obtain the desired patterns in both the arrangement of equipment for transmitting electron beams, as well as in the above-described neural network 10, an electronic circuit means 5 can be used. It is this electronic circuit means 5 that implements the presently-invented method for determining a precompensated pattern of exposure doses of an electron beam required per pattern position to obtain a desired pattern in coating a substrate. The electric circuit means 5 is also used in the device for determining the exposure dose of an electron beam required per pattern position to obtain a desired pattern in the coating on a substrate. Specifically, the electrical circuit means 5 effectively implements the neural network 10 to determine the exposure dose. See FIG. 8.

What is claimed is:

1. A method for determining a precompensated pattern of exposure doses of an electron beam required per pattern position to obtain a desired pattern in a coating on a substrate, the method comprising the steps of:
   determining a smearing function of the electron beam; and
   determining a precompensated pattern with the smearing function and a desired pattern, wherein the determination is performed such that electron beam exposure doses contain almost exclusively positive values and that the electron beam exposure doses are smooth relative to each other, wherein the step of determining the precompensated pattern comprises the steps of:
   a) estimating a regularization parameter;
   b) determining a precompensated pattern with all pattern points of the desired pattern with the exception of a determined pattern point;
   c) smearing the precompensated pattern again with the smearing function in order to predict the dose of the determined pattern point;
   d) repeating steps b) and c) for each pattern point;
   e) repeating steps a) to d) with an adapted regularization parameter until a final value of a regularization parameter is obtained; and
   f) determining the precompensated pattern with the final value of the regularization parameter.

2. The method as claimed in claim 1, wherein step b) is determined utilizing the following iterative equation:

$$d^{(l)} = d^{(l-1)} + (K^v K + \lambda B(D))^{-1} K^v r^{(l-1)} r^{(l)} = a - K d^{(l)}$$

with $d^{(0)} = 0$ and $r^{(0)} = a$
wherein a is a vector with the doses of the desired pattern as elements, d is a vector with the exposure doses of the precompensated pattern, K is the smearing function in matrix form, $K^v$ is the Hennitian conjugate of the smearing function K, B is an operator and $\lambda$ a regularization parameter.

3. The method as claimed in claim 2, wherein the operator B is defined as follows:

$$B(D) = \sum_i \left(\frac{d_i}{d_{tot}}\right) \ln\left(\frac{d_i}{d_{tot}}\right)$$

in which the summation takes place over all pattern points, $d_i$ is the $i^{th}$ element of the vector d, and $d_{tot}$ represents the summation over all elements of the vector d.

4. The method as claimed in claim 1, wherein the final value of the regularization parameter in step e) is the regularization parameter $$\frac{1}{N}\sum_{k=1}^{N}(a_k - [Kd_k(\lambda)]_k)^2$$

wherein N is the total number of pattern points, a is a vector with the doses of the desired pattern as elements, d is a vector with the exposure doses of the precompensated pattern and K is the smearing function in matrix form.

5. The method as claimed in claim 1, wherein the final value of the regularization parameter in step e) is the minimal regularization parameter $$\frac{1}{N}\sum_{k=1}^{N}(a_k - [Kd^k(\lambda)]_k)^2 w_{kk}(\lambda)$$

wherein N is the total number of pattern points, a is a vector with the doses of the desired pattern as elements, d is a vector with the exposure doses of the precompensated pattern, K is the smearing function in matrix form and $W_{kk}$ is defined as:

$$w_{kk}(\lambda) = \left[\frac{1 - a_{kk}(\lambda)}{1 - \frac{1}{N}\sum_{j=1}^{N} a_{jj}(\lambda)}\right]^2$$

with $a_{kk}$ the elements of the matrix $A = K(K^T K + \lambda L(D)^T L(D))^{-1} K^T$ and L the Laplace operator.

6. The method as claimed in claim 1, wherein after step e) the step is performed of training a neural network using one or more desired first patterns and the associated precompensated patterns.

7. The method as claimed in claim 6, wherein the precompensated pattern associated with a second desired pattern can be determined with the trained neural network.

8. The method as claimed in claim 7, wherein the first desired pattern is a relatively simple training pattern and the second desired pattern is a partial pattern of an integrated circuit.

9. The method as claimed in claim 8, wherein two or more partial patterns can be combined into a composite pattern of the integrated circuit.

10. The method as claimed in claim 6, wherein the neural network is a radial base function network.

11. The method as claimed in claim 6, wherein the neural network is implemented in hardware.

12. The method as claimed in claim 11, wherein the neural network is implemented in analog hardware.

13. The method as claimed in claim 1, wherein the smearing function is made up of at least two Gaussian functions.

14. The method as claimed in claim 13, wherein an exponential function is added to the smearing function.

15. The method as claimed in claim 13, wherein the parameters of the Gaussian functions can be determined using statistical simulations.

16. The method as claimed in claim 13, wherein the parameters of the Gaussian functions can be determined by measurements.

17. A device for determining the exposure dose of an electron beam required per pattern position to obtain a desired pattern in a coating on a substrate, comprising electronic circuit means for implementing a neural network having weighting factors determined by training the neural network by using as inputs one or more desired patterns and corresponding precompensation patterns determined by the steps of:

a) estimating a regularization parameter;

b) determining a precompensated pattern with all pattern points of the desired pattern with the exception of a determined pattern point;

c) smearing the precompensated pattern with a smearing function in order to predict the dose of the determined pattern point;

d) repeating steps b) and c) for each pattern point;

e) repeating steps a) to d) with adapted regularization parameter until a final value of a regularization parameter is obtained; and f) determining the precompensated pattern with the final value of the regularization parameter.

* * * * *

UNITED STATES PATENT AND TRADEMARK OFFICE
CERTIFICATE OF CORRECTION

PATENT NO. : 6,920,368 B1
DATED : July 19, 2005
INVENTOR(S) : Van Dyck et al.

It is certified that error appears in the above-identified patent and that said Letters Patent is hereby corrected as shown below:

Column 2,
Line 15, "$K^\forall$ is the Hermitian" should read -- $K^v$ is the Hermitian --.

Column 5,
Line 10, "$K^\forall$ is the Hermitian" should read -- $K^v$ is the Hermitian --.

Column 8,
Line 11, "is the Hennitian conjugate" should read -- is the Hermitian conjugate --.

Signed and Sealed this

Seventh Day of February, 2006

JON W. DUDAS
*Director of the United States Patent and Trademark Office*